United States Patent
Cheng et al.

(10) Patent No.: US 11,217,158 B2
(45) Date of Patent: Jan. 4, 2022

(54) PIXEL STRUCTURE AND DISPLAY PANEL

(71) Applicant: AU Optronics Corporation, Hsin-Chu (TW)

(72) Inventors: Mao-Hsun Cheng, Hsin-Chu (TW); Cheng-Han Huang, Hsin-Chu (TW); Ching-Sheng Cheng, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 17/004,042

(22) Filed: Aug. 27, 2020

(65) Prior Publication Data

US 2021/0241686 A1 Aug. 5, 2021

(30) Foreign Application Priority Data

Feb. 4, 2020 (TW) .................................. 109103324

(51) Int. Cl.
*G09G 3/32* (2016.01)
*G09G 3/3225* (2016.01)
*G09G 3/20* (2006.01)
*G09G 3/3291* (2016.01)
*H01L 27/32* (2006.01)

(52) U.S. Cl.
CPC ......... *G09G 3/3225* (2013.01); *G09G 3/2003* (2013.01); *G09G 3/3291* (2013.01); *H01L 27/3216* (2013.01); *H01L 27/3218* (2013.01); *H01L 27/3276* (2013.01); *G09G 2300/0452* (2013.01); *G09G 2310/0286* (2013.01)

(58) Field of Classification Search
CPC ...... G09G 3/2003; G09G 3/32; G09G 3/3291; G09G 3/36; G09G 5/00; H01L 27/32; G06F 3/038
See application file for complete search history.

(56) References Cited

U.S. PATENT DOCUMENTS

| | | | |
|---|---|---|---|
| 2014/0184479 A1 | 7/2014 | Wu | |
| 2015/0187265 A1* | 7/2015 | Zhang | G09G 3/3291 345/212 |
| 2016/0372535 A1* | 12/2016 | Lee | H01L 27/3223 |
| 2017/0154943 A1 | 6/2017 | Yang et al. | |
| 2018/0069191 A1* | 3/2018 | Lee | H01L 27/3276 |
| 2019/0371232 A1* | 12/2019 | Kim | G09G 3/32 |
| 2020/0394947 A1* | 12/2020 | Hao | G09G 3/2003 |

FOREIGN PATENT DOCUMENTS

| | | |
|---|---|---|
| CN | 102903732 A | 1/2013 |
| CN | 104867450 A | 8/2015 |
| CN | 108364991 A | 8/2018 |
| TW | 202004722 A | 1/2020 |

* cited by examiner

*Primary Examiner* — Pegeman Karimi

(74) *Attorney, Agent, or Firm* — WPAT, PC

(57) ABSTRACT

A pixel structure includes a light-emitting module, multiple sub-pixel circuits, and an internal driving circuit. The light-emitting module includes multiple sub-pixel light-emitting elements, and is disposed on a first plane. The multiple sub-pixel circuits are disposed on a second plane, and each of the multiple sub-pixel circuits is electrically connected with a corresponding one of the multiple sub-pixel light-emitting elements. The internal driving circuit is disposed on the second plane, and is electrically connected with one of the multiple sub-pixel circuits. The first plane is different from the second plane, and the multiple sub-pixel circuits and the internal driving circuit are located in a vertical projection projected by the light-emitting module onto the second plane.

20 Claims, 11 Drawing Sheets

PIXEL STRUCTURE AND DISPLAY PANEL

CROSS-REFERENCE TO RELATED APPLICATION

This application claims priority to Taiwan Application Serial Number 109103324, filed Feb. 4, 2020, which is herein incorporated by reference in its entirety.

BACKGROUND

Technical Field

The present disclosure relates to a display panel, and more particularly, to a display with narrow bezel.

Description of Related Art

The narrow bezel design is often used in personal computer monitors or televisions to create a visual immersion when playing games or watching movies. In recent years, with the popularization of mobile devices, narrow bezel technology has also been widely used in mobile devices to provide the optimal visual effects when the volume of the device is limited. However, the peripheral area of the display panel is usually provided with many demultiplexers, test circuits, shift registers, etc., and these peripheral circuits make it difficult to further reduce the width of the bezel.

SUMMARY

The present disclosure is to provide a pixel structure, which includes a light-emitting module, multiple sub-pixel circuits, and an internal driving circuit. The light-emitting module includes multiple sub-pixel light-emitting elements, and is disposed on a first plane. The sub-pixel circuits are disposed on a second plane, and each of the sub-pixel circuits is electrically connected to a corresponding one of the sub-pixel light-emitting elements. The internal driving circuit is disposed on the second plane, and is electrically connected to one of the sub-pixel circuits. The first plane is different from the second plane, and the sub-pixel circuits and the internal driving circuit are located in a vertical projection projected by the light-emitting module onto the second plane.

The present disclosure is to provide a display panel, which includes N multiplex control lines, M test control lines, and multiple pixel structures. N multiplex control lines extend in a first direction. M test control lines extend in the first direction, in which N and M are positive integers. A portion of the pixel structures includes a light-emitting module, multiple sub-pixel circuits, and an internal driving circuit. The light-emitting module includes multiple sub-pixel light-emitting elements, and is disposed on a first plane. The sub-pixel circuits are disposed on a second plane, and each of the sub-pixel circuits is electrically connected to a corresponding one of the sub-pixel light-emitting elements. The internal driving circuit is disposed on the second plane, electrically connected to one of the N multiplex control lines or one of the M test control lines, and electrically connected to one of the sub-pixel circuits. The first plane is different from the second plane, and the sub-pixel circuits and the internal driving circuit are located in a vertical projection projected by the light-emitting module onto the second plane.

The present disclosure is to provide a display panel, which includes a peripheral area and an active area. The active area is configured to provide a display picture, and includes a test wiring area, a central area, and a multiplex wiring area. Each of the test wiring area, the central area, and the multiplex wiring area includes multiple pixel structures, and each of the pixel structures includes a light-emitting module and multiple sub-pixel circuits. The light-emitting module includes multiple sub-pixel light-emitting elements. Each of the sub-pixel circuits is electrically connected to a corresponding one of the sub-pixel light-emitting elements. Each of the pixel structures in the test wiring area and the multiplex wiring area further includes an internal driving circuit, the internal driving circuit is coupled to one of the sub-pixel circuits, and each of the pixel structures in the central area does not comprise the internal driving circuit.

The aforementioned pixel structure and display panel are helpful to further reduce the limit of the width of the bezel in the narrow bezel design.

It is to be understood that both the foregoing general description and the following detailed description are by examples, and are intended to provide further explanation of the disclosure as claimed.

DETAILED DESCRIPTION

Figure 1:
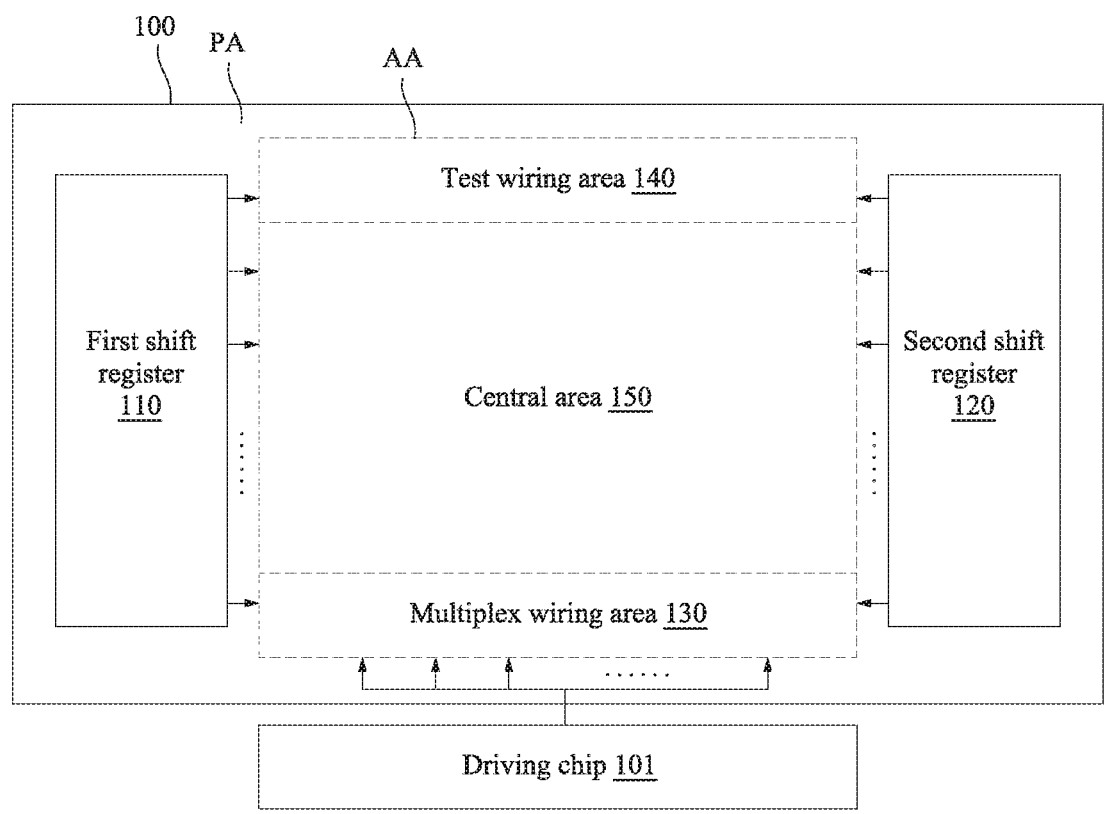
FIG. 1 illustrates a simplified functional block diagram of a display panel according to an embodiment of the present disclosure.

Reference will now be made in detail to the present embodiments of the disclosure, examples of which are illustrated in the accompanying drawings. In the drawings, the same reference numerals indicate the same or similar elements or method flows.

FIG. 1 illustrates a simplified functional block diagram of a display panel 100 according to an embodiment of the present disclosure. The display panel 100 includes an active area AA, a peripheral area PA, a first shift register 110 and a second shift register 120. The active area AA includes multiple pixel structures PX. The multiple pixel structures PX are configured to receive data voltages from a driving chip 101 and configured to provide display pictures according to the data voltages. The first shift register 110 and the second shift register 120 are disposed in the peripheral area PA surrounding the active area AA, and are configured to drive the pixel structures PX in the active area AA to receive the data voltages. The active area AA includes a multiplex wiring area 130, a test wiring area 140, and a central area 150. By disposing demultiplexers and circuits for testing the function in the multiplex wiring area 130 and the test wiring area 140, respectively, the width of the peripheral area PA can be reduced in the display panel 100, so that the width of the bezel is reduced. In order to simplify the drawing to explain easily, the other components and the connection relationship in the display panel 100 are not shown in FIG. 1. Moreover, in some embodiments, the display panel 100 may also use a single shift register with a larger driving capacity.

Figure 2:
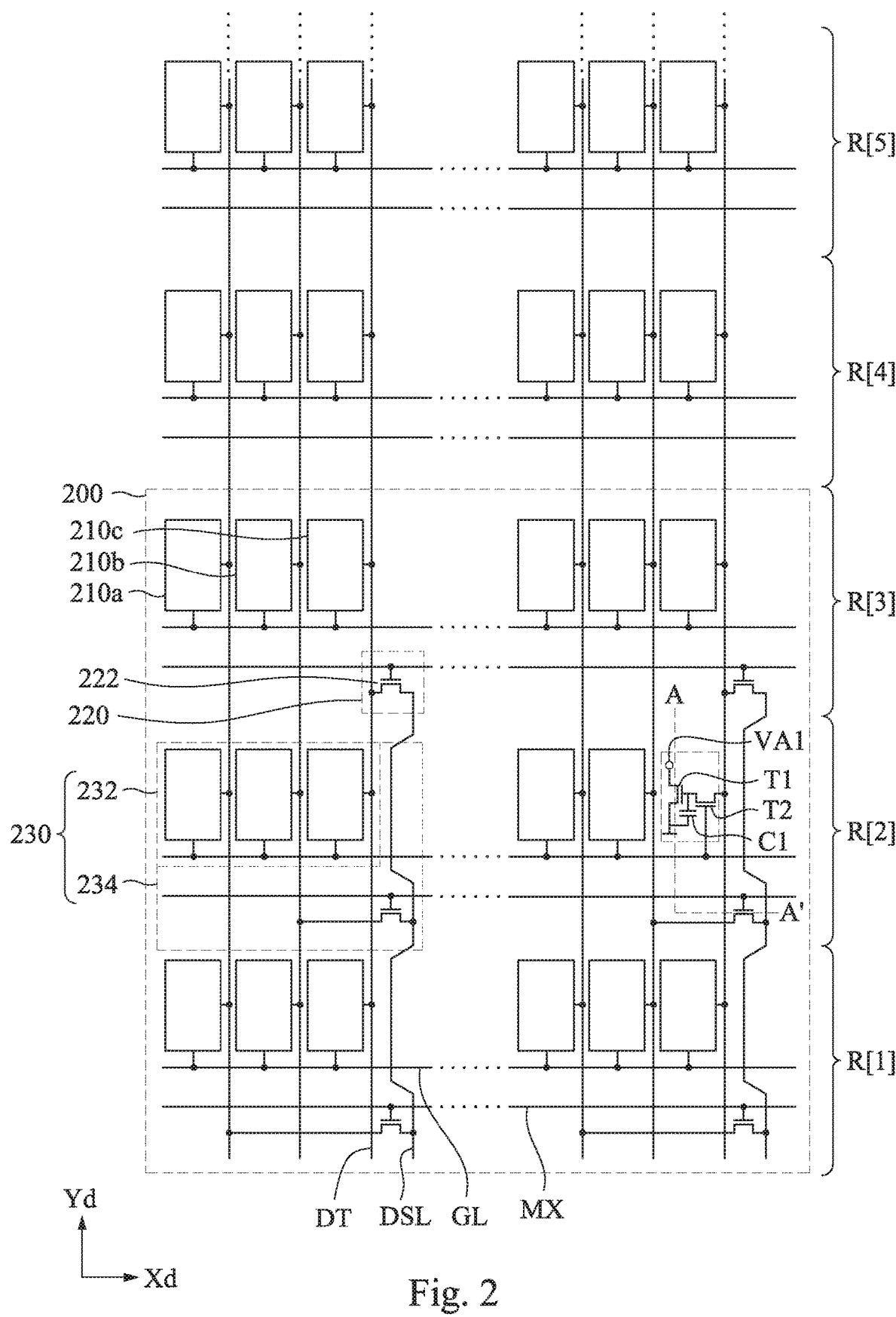
FIG. 2 illustrates a simplified functional block diagram of a multiplex wiring area according to an embodiment of the present disclosure.
Figure 3:
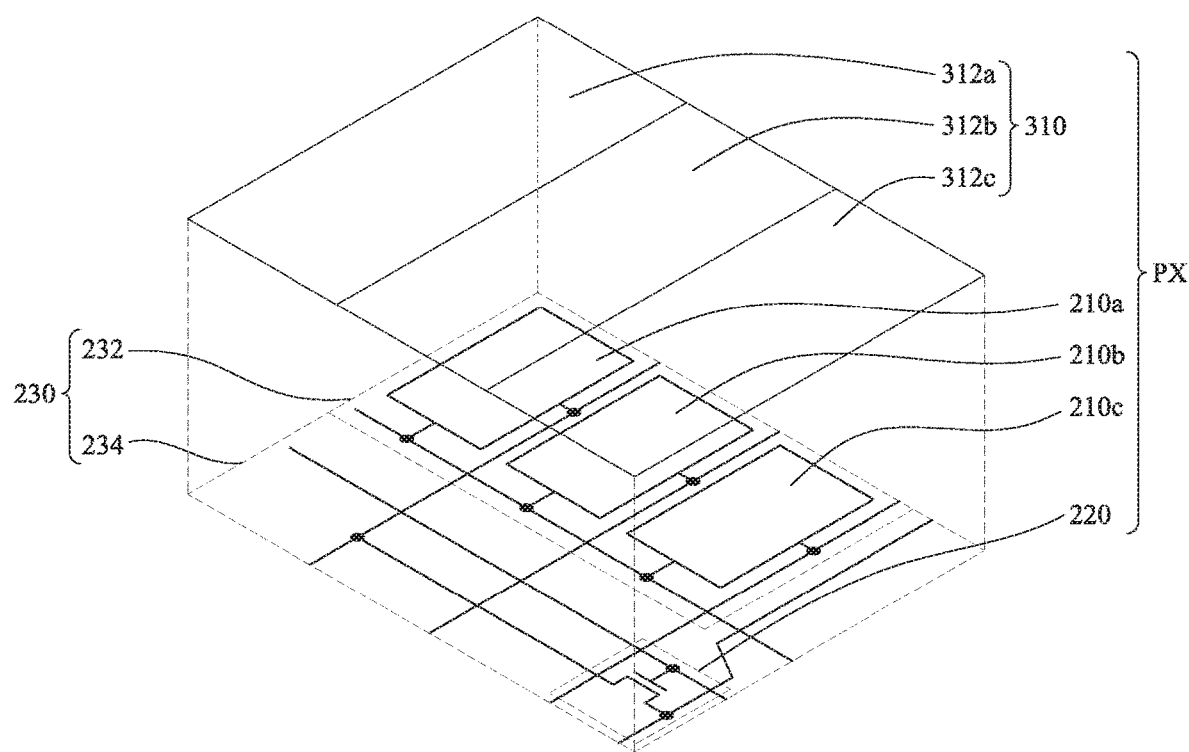
FIG. 3 illustrates a simplified functional block diagram of a pixel structure according to an embodiment of the present disclosure.
Figure 4:
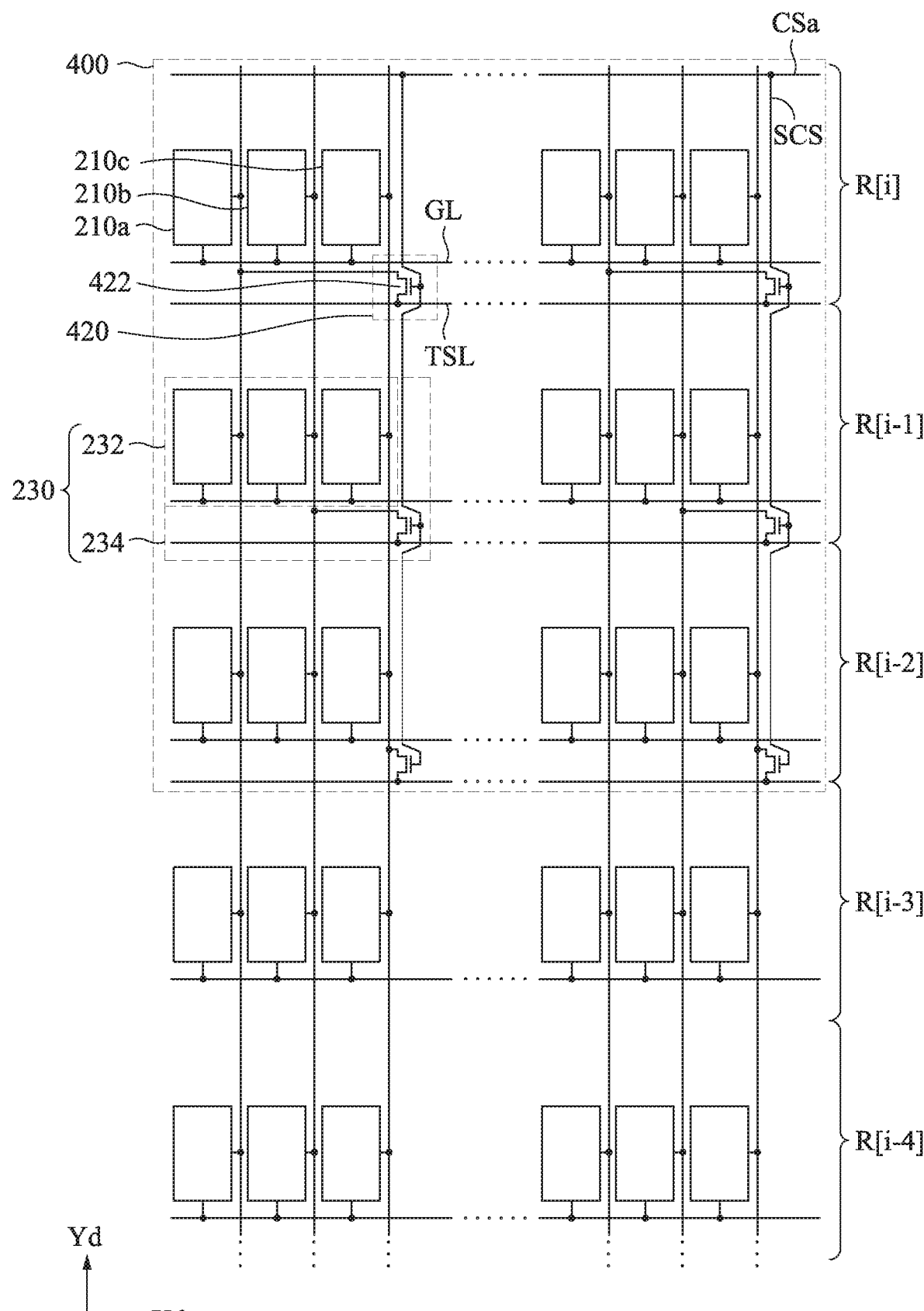
FIG. 4 illustrates a simplified functional block diagram of a test wiring area according to an embodiment of the present disclosure.

FIG. 2 illustrates a simplified functional block diagram of a multiplex wiring area 200 according to an embodiment of the present disclosure. FIG. 3 illustrates a simplified functional block diagram of a pixel structure PX according to an embodiment of the present disclosure. FIG. 4 illustrates a simplified functional block diagram of a test wiring area 400 according to an embodiment of the present disclosure. In an embodiment, the multiplex wiring area 130 and the test wiring area 140 in FIG. 1 are implemented by the multiplex wiring area 200 in FIG. 2 and the test wiring area 400 in FIG. 4, respectively. Reference is made to FIG. 2 and FIG. 3 first. Each pixel structure PX in the multiplex wiring area 200 includes multiple sub-pixel circuits 210 (e.g., a first sub-pixel circuit 210a, a second sub-pixel circuit 210b, and a third sub-pixel circuit 210c), an internal driving circuit 220 and a light-emitting module 310. The light-emitting module 310 includes multiple sub-pixel light-emitting elements 312 (e.g., a first sub-pixel light-emitting element 312a, a second sub-pixel light-emitting element 312b, and a third sub-pixel light-emitting element 312c). Each of the sub-pixel circuits 210 is electrically connected to a corresponding one of the multiple sub-pixel light-emitting elements 312 to drive said sub-pixel light-emitting element 312 to emit light. For example, in the present embodiment, the first sub-pixel circuit 210a, the second sub-pixel circuit 210b, and the third sub-pixel circuit 210c are electrically connected to the first sub-pixel light-emitting element 312a, the second sub-pixel light-emitting element 312b, and third sub-pixel light-emitting element 312c, respectively.

In some embodiments, the sub-pixel light-emitting element 312 may be implemented by organic light-emitting diodes (OLED) or micro light-emitting diodes (Micro LED).

Moreover, in the specification and drawings, if one element numeral is used without indicating the index of the element numeral, it means that the element numeral refers to any unspecified element in the element group to which it belongs. For example, the element numeral 210a refers to the first sub-pixel circuit 210a, and the element numeral 210 refers to any unspecified sub-pixel circuit among the first sub-pixel circuit 210a, the second sub-pixel circuit 210b, and the third sub-pixel circuit 210c. For another example, the element numeral 312a refers to the first sub-pixel light-emitting element 312a, and the element numeral 312 refers to any unspecified sub-pixel light-emitting element among the first sub-pixel light-emitting element 312a, the second sub-pixel light-emitting element 312b, and the third sub-pixel light-emitting element 312c.

As shown in FIG. 2, the display panel 100 further includes multiple gate lines GL extending in the first direction Xd and multiple data transmission lines DT extending in the second direction Yd. The multiple gate lines GL are coupled to the first shift register 110 and the second shift register 120 in FIG. 1. The positions of the multiple sub-pixel circuits 210 correspond to the intersections of the multiple gate lines GL and the multiple data transmission lines DT, and each of the sub-pixel circuits 210 is electrically connected to a corresponding one of the multiple gate lines GL and a corresponding one of the multiple data transmission lines DT. Each data transmission line DT is electrically connected to all sub-pixel circuits 210 included in a corresponding column.

In the present embodiment, the sub-pixel circuit 210 may include a transistor T1, a transistor T2, a capacitor C1, and a first via hole VA1, and the sub-pixel circuit 210 is electrically connected to the sub-pixel light-emitting element 312 through the first via hole VA1, but the circuit structure of the sub-pixel circuit 210 in the present disclosure is not limited thereto.

The pixel structures PX in the display panel 100 are arranged as i pixel rows R[1]-R[i] in the second direction Yd, and the multiplex wiring area 200 includes the first three pixel rows R[1]-R[3] of the i pixel rows R[1]-R[i], in which i is a positive integer. The multiplex wiring area 200 further includes multiple data source lines DSL extending in the second direction Yd and multiple (e.g., three) multiplex control lines MX extending in the first direction Xd. The multiple data source lines DSL are electrically connected to the driving chip 101 in FIG. 1 to receive the data voltages. The multiple multiplex control lines MX and multiple data source lines DSL can be disposed only to the pixel rows R[1]-R[3] without extending to the other pixel rows. In other words, multiple multiplex control lines MX and multiple data source lines DSL can only be electrically connected to the pixel structures PX in the pixel rows R[1]-R[3].

The internal driving circuit 220 includes a transistor 222, and the transistor 222 includes a first terminal, a second terminal, and a control terminal. The first terminal of the transistor 222 is coupled to a corresponding one of the multiple data source lines DSL. The second terminal of the transistor 222 is coupled to a corresponding one of the multiple data transmission lines DT. The gate terminals of the transistors 222 disposed in the same pixel row are coupled to the same multiplex control line MX.

Among the multiple transistors 222 electrically connected to the same data source line DSL, the transistor 222 disposed in the pixel row R[1] is electrically connected to the data transmission line DT configured to drive the first sub-pixel circuit 210a; the transistor 222 disposed in the pixel row R[2] is electrically connected to the data transmission line DT configured to drive the second sub-pixel circuit 210b; the transistor 222 disposed in the pixel row R[3] is electrically connected to the data transmission line DT configured to drive the third sub-pixel circuit 210c.

In other words, the multiple transistors 222 electrically connected to the same data source line DSL are electrically connected to different data transmission lines DT to distribute the data voltage to different sub-pixel circuits, but the corresponding relationship between the transistors 222 of the pixel rows R[1]-R[3] and the sub-pixel circuits is not limited to the embodiment of FIG. 2. The multiple internal driving circuits 220 electrically connected to the same data source line DSL form a one-to-three demultiplexer, and the demultiplexer can be used to distribute the data voltage on the same data source line DSL to different data transmission lines DT.

The first sub-pixel light-emitting element 312a, the second sub-pixel light-emitting element 312b, and the third sub-pixel light-emitting element 312c are respectively configured to provide red light, green light and blue light, but the color arrangement of the sub-pixels of the present embodiment is not limited thereto.

In the present embodiment, the multiple sub-pixel circuits 210 and the internal driving circuit 220 are located in the vertical projection 230 of the light-emitting module 310. The vertical projection 230 includes a first area 232 and a second area 234, in which the multiple sub-pixel circuits 210 are located in the first area 232, and the internal driving circuit 220 is located in the second area 234. In some embodiments, the shape of the first area 232 includes a rectangle, and the shape of the second area 234 includes an L-shape, in which the second area 234 may be connected to two adjacent sides of the first area 232.

Reference is made to FIG. 4. The test wiring area 400 includes a first test control line CSa, multiple sub-test control lines SCS and multiple (e.g., three) test source lines TSL, in which the first test control line CSa is electrically connected to the multiple sub-test control lines SCS. The first test control line CSa and the multiple test source lines TSL extend in the first direction Xd, and the multiple sub-test control lines SCS extend in the second direction Yd. The test wiring area 400 includes the last three pixel rows R[i-2]-R[i] of the pixel rows R[1]-R[i]. The multiple sub-test control lines SCS and the multiple test source lines TSL can be disposed only to the last three pixel rows R[i-2]-R[i] without extending to the other pixel rows. In other words, the multiple sub-test control lines SCS and the multiple test source lines TSL can be electrically connected only to the pixel structures PX of the pixel rows R[i-2]-R[i].

The pixel structures PX of the test wiring area 400 are similar to the pixel structures PX of the multiplex wiring area 200. Each of the pixel structures PX of the test wiring area 400 includes the first sub-pixel circuit 210a through the third sub-pixel circuit 210c, the first sub-pixel light-emitting element 312a through the third sub-pixel light-emitting element 312c, and an internal driving circuit 420. The internal driving circuit 420 includes a transistor 422, and the transistor 422 includes a first terminal, a second terminal, and a control terminal. The first terminal and the second terminal of the transistor 422 are respectively coupled to a corresponding one of the multiple test source lines TSL and a corresponding one of the multiple data transmission lines DT, and the transistors 422 disposed in the same pixel row are coupled to the same test source line TSL.

The control terminal of the transistor 422 is coupled to a corresponding one of the sub-test control lines SCS. Among the multiple transistors 422 electrically connected to the same sub-test control line SCS, the transistor 422 disposed in the pixel row R[i] is electrically connected to the data transmission line DT configured to drive the first sub-pixel circuit 210a; the transistor 422 disposed in the pixel row R[i-1] is electrically connected to the data transmission line DT configured to drive the second sub-pixel circuit 210b; the transistor 422 disposed in the pixel row R[i-2] is electrically connected to the data transmission line DT configured to drive the third sub-pixel circuit 210c. In other words, the multiple transistors 422 electrically connected to the same sub-test control line SCS are electrically connected to different data transmission lines DT to distribute the test voltage to different sub-pixel circuits, but the corresponding relationship between the transistors 422 of the pixel rows R[i]-R[i-2] and the sub-pixel circuits is not limited to the embodiment of FIG. 4.

In some embodiments, when a quality test is performed on the display panel 100, the first test control line CSa simultaneously conducts all transistors 422, so that the test voltage on the multiple test source lines TSL is distributed to multiple data transmission lines DT correspondingly.

The other connection methods, components, implementations, and advantages of the aforementioned multiplex wiring area 200 are all applicable to the test wiring area 400. For clarity, the further description is not given herein.

It is worth noting that, in the embodiment of that the multiplex wiring area 130 and the test wiring area 140 in FIG. 1 are respectively implemented by the multiplex wiring area 200 in FIG. 2 and the test wiring area 400 in FIG. 4, each data transmission line DT is electrically connected to one of the multiple data source lines DSL and one of the multiple test source lines TSL through the transistor 222 and the transistor 422, respectively.

Figure 5:
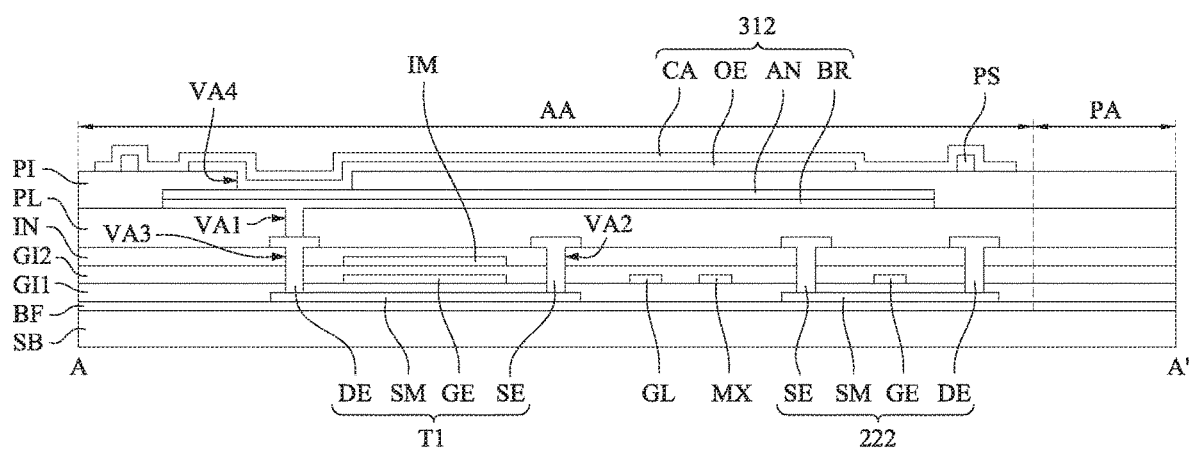
FIG. 5 illustrates a simplified cross-sectional schematic diagram taken along the line A-A' in FIG. 2.

FIG. 5 illustrates a simplified cross-sectional schematic diagram taken along the line A-A' in FIG. 2. As shown in FIG. 5, the display panel 100 includes a substrate SB, a buffer layer BF, a first gate insulating layer GI1, a second gate insulating layer GI2, an interlayer dielectric layer IN, a planarization layer PL and a pixel definition layer PI which are stacked in the order from bottom to top. A transistor T1 includes a source electrode SE, a drain electrode DE, a gate electrode GE, and a semiconductor layer SM. The semiconductor layer SM is disposed on the buffer layer BF, and the first gate insulating layer GI1 covers the semiconductor layer SM. The gate electrode GE is disposed on the first gate insulating layer GI1, and the second gate insulating layer GI2 covers the gate electrode GE. The source electrode SE and the drain electrode DE are disposed on the interlayer dielectric layer IN, in which the source electrode SE and the drain electrode DE pass through the interlayer dielectric layer IN, the second gate insulating layer GI2, and the first gate insulating layer GI1 respectively through the second via hole VA2 and the third via hole VA3 to be electrically connected to the semiconductor layer SM. The structure of the transistor 222 is similar to that of the transistor T1, and the further description is not given herein for clarity.

The sub-pixel light-emitting element 312 includes a bridge layer BR, an anode AN, a cathode CA, and an organic light-emitting layer OE. The bridge layer BR is disposed on the planarization layer PL, and passes through the bridge layer BR through the first via hole VA1 to be electrically connected to the drain electrode DE of the transistor T1. The anode AN is disposed on the bridge layer BR, and the pixel definition layer PI covers the bridge layer BR and the anode AN. The organic light-emitting layer OE is disposed on the pixel definition layer PI, and passes through the pixel definition layer PI through the fourth via VA4 to be electrically connected to the anode AN. The cathode CA is disposed on the pixel definition layer PI, and covers the organic light-emitting layer OE. In some embodiments, the pixel structure PX may further include multiple photo spacers PS disposed on the pixel definition layer PI, in which the cathode CA covers the multiple photo spacers PS.

In the present embodiment, the pixel structure PX may further include an interlayer metal layer IM. The interlayer metal layer IM is disposed on the first gate insulating layer GI1, and the second gate insulating layer GI2 covers the interlayer metal layer IM. The interlayer metal layer IM is configured to form the capacitor C1 in FIG. 2 with the gate electrode GE of the transistor 222, but the present disclosure is not limited thereto. In practice, the capacitor C1 in FIG. 2 can be realized by any two types of conductors located on different layers in FIG. 3.

As can be seen from the above, the first sub-pixel circuit 210a, the second sub-pixel circuit 210b, the third sub-pixel circuit 210c and the internal driving circuit 220 may be disposed on the same layer or the same plane, such as the upper surface of the buffer layer BF. The light-emitting module 310 may be disposed on another plane, such as the upper surface of the planarization layer PL. At this time, the first sub-pixel circuit 210a, the second sub-pixel circuit 210b, the third sub-pixel circuit 210c, and the internal driving circuit 220 are located within the vertical projection 230 projected by the light-emitting module 310 onto the upper surface of the buffer layer BF.

Figure 6:
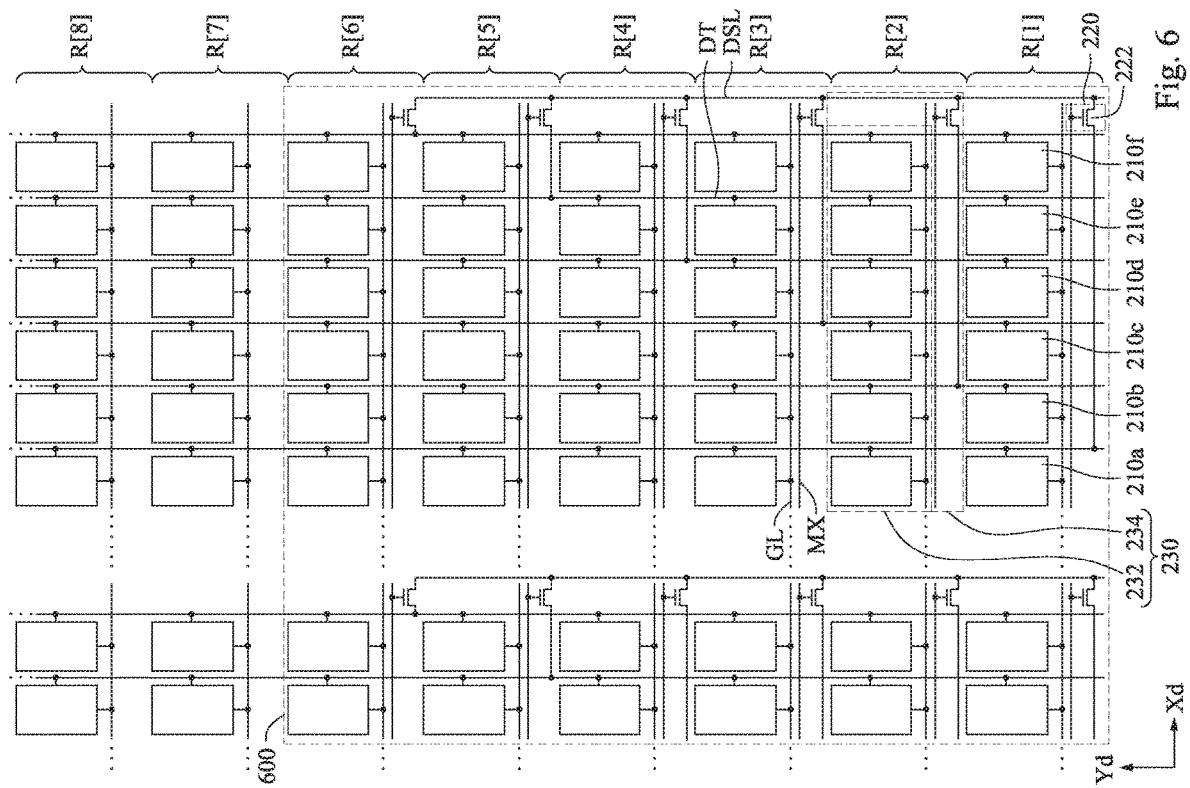
FIG. 6 illustrates a simplified functional block diagram of a multiplex wiring area according to another embodiment of the present disclosure.
Figure 7:
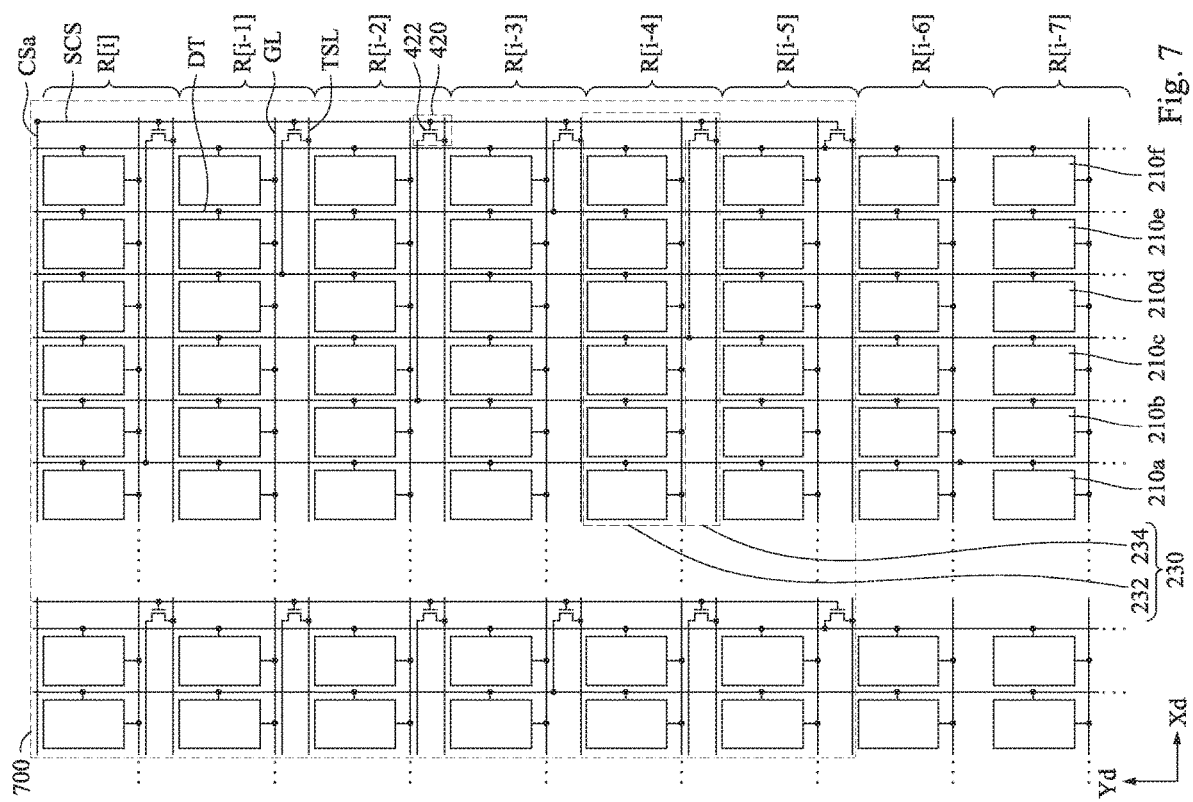
FIG. 7 illustrates a simplified functional block diagram of a test wiring area according to another embodiment of the present disclosure.

FIG. 6 illustrates a simplified functional block diagram of a multiplex wiring area 600 according to another embodiment of the present disclosure. FIG. 7 illustrates a simplified functional block diagram of a test wiring area 700 according to another embodiment of the present disclosure. In an embodiment, the multiplex wiring area 130 and the test wiring area 140 in FIG. 1 are implemented by the multiplex wiring area 600 in FIG. 6 and the test wiring area 700 in FIG. 7, respectively. The pixel structures PX of the multiplex wiring area 600 and the test wiring area 700 are similar to the pixel structures PX of the multiplex wiring area 200 and the test wiring area 400, respectively. The difference is that the pixel structures PX of the multiplex wiring area 600 and the test wiring the line area 700 include six sub-pixel circuits 210, such as the first sub-pixel circuit 210a, the second sub-pixel circuit 210b, the third sub-pixel circuit 210c, the fourth sub-pixel circuit 210d, the fifth sub-pixel circuit 210e, and the sixth sub-pixel circuit 210f. Each of said six sub-pixel circuits 210 is coupled to a corresponding sub-pixel light-emitting element 312. Therefore, the light-emitting modules 310 of the pixel structures PX in FIG. 6 and FIG. 7 each include six sub-pixel light-emitting elements 312 (not shown in the figure) correspondingly.

The six sub-pixel light-emitting elements 312 electrically connected to the first sub-pixel circuit 210a, the second sub-pixel circuit 210b, the third sub-pixel circuit 210c, the fourth sub-pixel circuit 210d, the fifth sub-pixel circuit 210e and the sixth sub-pixel circuit 210f correspondingly are configured to provide red light, green light, blue light, red light, green light, and blue light, respectively, but the color arrangement of the sub-pixels in the present embodiment is not limited thereto.

Reference is made to FIG. 6. The multiplex wiring area 600 is similar to the multiplex wiring area 200 in FIG. 2, one of the differences is that the multiplex wiring area 600 includes the first six pixel rows R[1]-R[6] of the pixel rows R[1]-R[n]. Multiple data source lines DSL and multiple (e.g., six) multiplex control lines MX in the multiplex wiring area 600 can be disposed in the first six pixel rows R[1]-R[6] without extending to other pixel rows, that is, multiple data source lines DSL and multiple multiplex control lines MX can be electrically connected only to the pixel structures PX of the pixel rows R[1]-R[6]. Multiple transistors 222 electrically connected to the same data source line DSL are electrically connected to different data transmission lines DT to distribute the data voltage to different sub-pixel circuits, but the corresponding relationship between the transistors 222 of the pixel rows R[1]-R[6] and the sub-pixel circuits is not limited to the embodiment of FIG. 6. Therefore, the multiple internal driving circuits 220 electrically connected to the same data source line DSL form a one-to-six demultiplexer.

Reference is made to FIG. 7. The test wiring area 700 is similar to the test wiring area 400 in FIG. 4, one of the differences is that the test wiring area 700 includes the last six pixel rows R[i-5]-R[i] of the pixel rows R[1]-R[n]. The multiple test source lines TSL and multiple sub-test control lines SCS in the test wiring area 700 can be disposed only in the last six pixel rows R[i-5]-R[i] without extending to the other pixel rows, that is, the multiple test source lines TSL and the multiple sub-test control lines SCS can be only coupled to the pixel structures PX of the pixel rows R[i-5]-R[i]. Multiple transistors 422 electrically connected to the same sub-test control line SCS are electrically connected to different data transmission lines DT to distribute the test voltage to different sub-pixel circuits, but the corresponding relationship between the transistors 422 of the pixel rows R[i]-R[i-5] and the sub-pixel circuits is not limited to the embodiment of FIG. 7.

Figure 8:
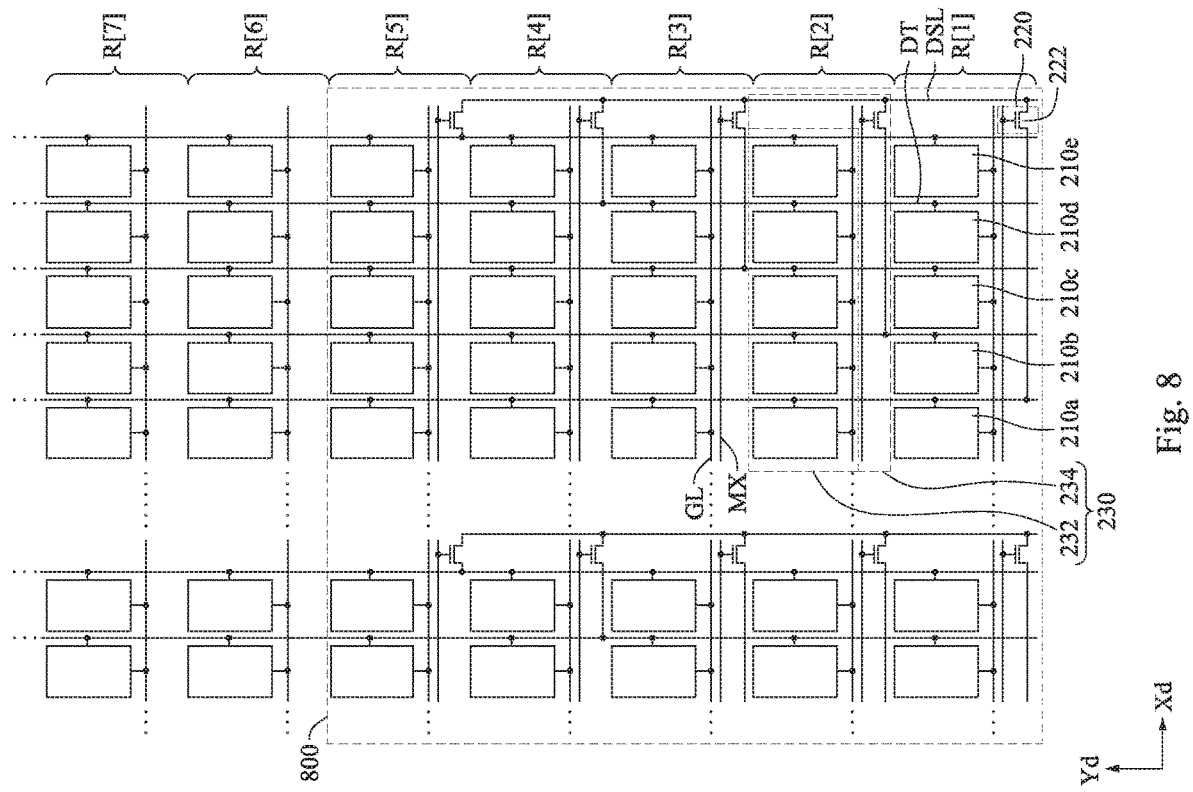
FIG. 8 illustrates a simplified functional block diagram of a multiplex wiring area according to another embodiment of the present disclosure.
Figure 9:
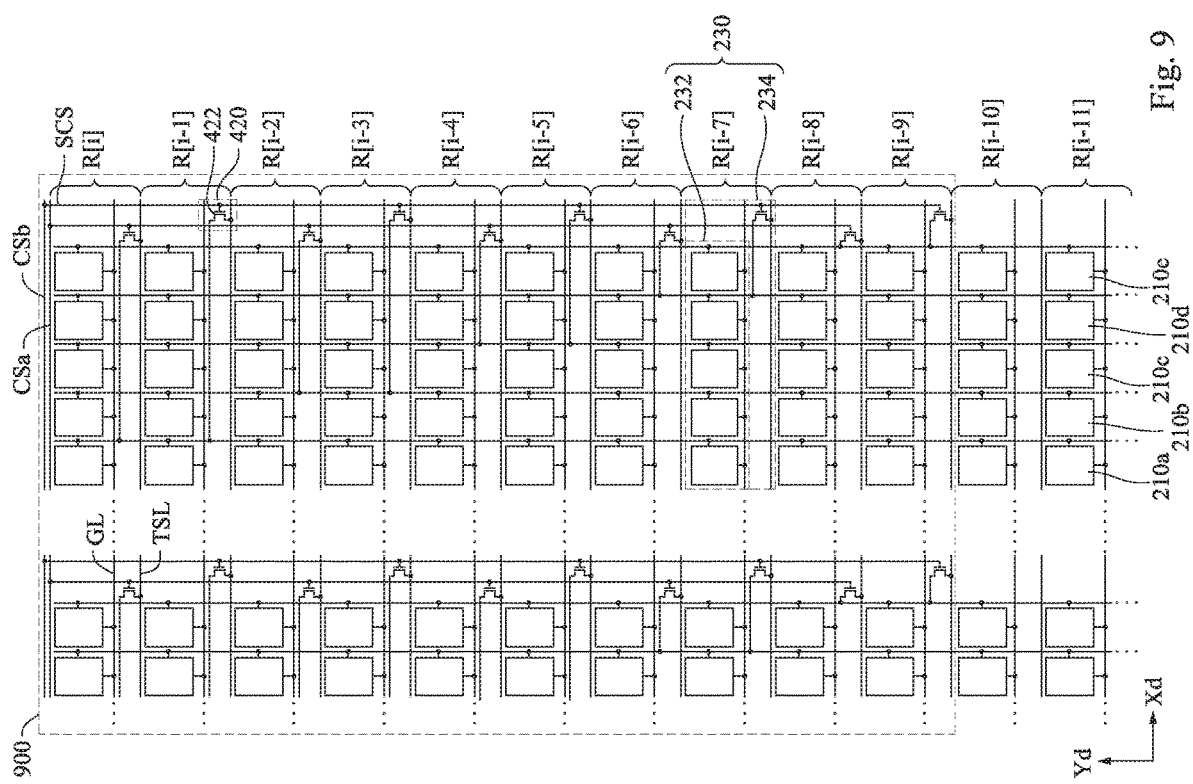
FIG. 9 illustrates a simplified functional block diagram of a test wiring area according to another embodiment of the present disclosure.

FIG. 8 illustrates a simplified functional block diagram of a multiplex wiring area 800 according to another embodiment of the present disclosure. FIG. 9 illustrates a simplified functional block diagram of the test wiring area 900 according to another embodiment of the present disclosure. In an embodiment, the multiplex wiring area 130 and the test wiring area 140 in FIG. 1 are implemented by the multiplex wiring area 800 in FIG. 8 and the test wiring area 900 in FIG. 9, respectively. The pixel structures PX of the multiplex wiring area 800 and the test wiring area 900 are similar to the pixel structures PX of the multiplex wiring area 200 and the test wiring area 400, respectively. The difference is that the pixel structures PX of the multiplex wiring area 800 and the test wiring area 900 include five sub-pixel circuits 210, such as the first sub-pixel circuit 210a, the second sub-pixel circuit 210b, the third sub-pixel circuit 210c, the fourth sub-pixel circuit 210d and the fifth sub-pixel circuit 210e. Each of said five sub-pixel circuits 210 is coupled to a corresponding sub-pixel light-emitting element 312. Therefore, the light-emitting modules 310 of the pixel structures PX in FIG. 8 and FIG. 9 each include five sub-pixel light-emitting elements 312 (not shown in the figure).

The five sub-pixel light-emitting elements 312 electrically connected to the first sub-pixel circuit 210a, the second sub-pixel circuit 210b, the third sub-pixel circuit 210c, the fourth sub-pixel circuit 210d, and the fifth sub-pixel circuit 210e correspondingly are configured to provide red light, green light, blue light, red light, and green light, respectively, but the color arrangement of the sub-pixels in the present embodiment is not limited thereto.

Reference is made to FIG. 8. The multiplex wiring area 800 is similar to the multiplex wiring area 200 in FIG. 2, one of the differences is that the multiplex wiring area 800 includes the first five pixel rows R[1]-R[5] of the pixel rows R[1]-R[n]. Multiple data source lines DSL and multiple (e.g., five) multiplex control lines MX in the multiplex wiring area 800 can be disposed in the first five pixel rows R[1]-R[5] without extending to the other pixel rows, that is, multiple data source lines DSL and multiplex control lines MX can be electrically connected only to the pixel structures PX of the pixel rows R[1]-R[5]. Multiple transistors 222 electrically connected to the same data source line DSL are electrically connected to different data transmission lines DT to distribute the data voltage to different sub-pixel circuits, but the corresponding relationship between the transistors 222 of the pixel rows R[1]-R[5] and the sub-pixel circuits is not limited to the embodiment in FIG. 8. Therefore, multiple internal driving circuits 220 electrically connected to the same data source line DSL form a one-to-five demultiplexer.

Reference is made to FIG. 9. The test wiring area 900 is similar to the test wiring area 400 in FIG. 4, the difference is that the test wiring area 900 includes the last ten pixel rows R[i-9]-R[i] of the pixel rows R[1]-R[n], and the test wiring area 900 further includes a second test control line CSb extending in the first direction Xd. The multiple test source lines TSL and multiple sub-test control lines SCS in the test wiring area 900 can be disposed only in the last ten pixel rows R[i-9]-R[i] without extending to the other pixel rows, that is, the multiple test source lines TSL and the multiple sub-test control lines SCS can be electrically connected only to the pixel structures PX of the pixel rows R[i-9]-R[i]. In the test wiring area 900, the internal driving circuits 420 disposed in adjacent rows are electrically connected to different test control lines, for example, the internal driving circuit 420 disposed in the pixel row R[i-2] is electrically connected to the first test control line Csa; the internal driving circuit 420 disposed in the pixel row R[i-1] is electrically connected to the second test control line Csb; the internal driving circuit 420 disposed in the pixel row R[i] is electrically connected to the first test control line Csa, and so on. In addition, multiple transistors 422 electrically connected to the same sub-test control line SCS is electrically connected to different data transmission lines DT to distribute the test voltage to different sub-pixel circuits, but the corresponding relationship between the transistor 422 of the pixel rows R[i-9]-R[i] and the sub-pixel circuits is not limited to the embodiment of FIG. 9.

Figure 10:
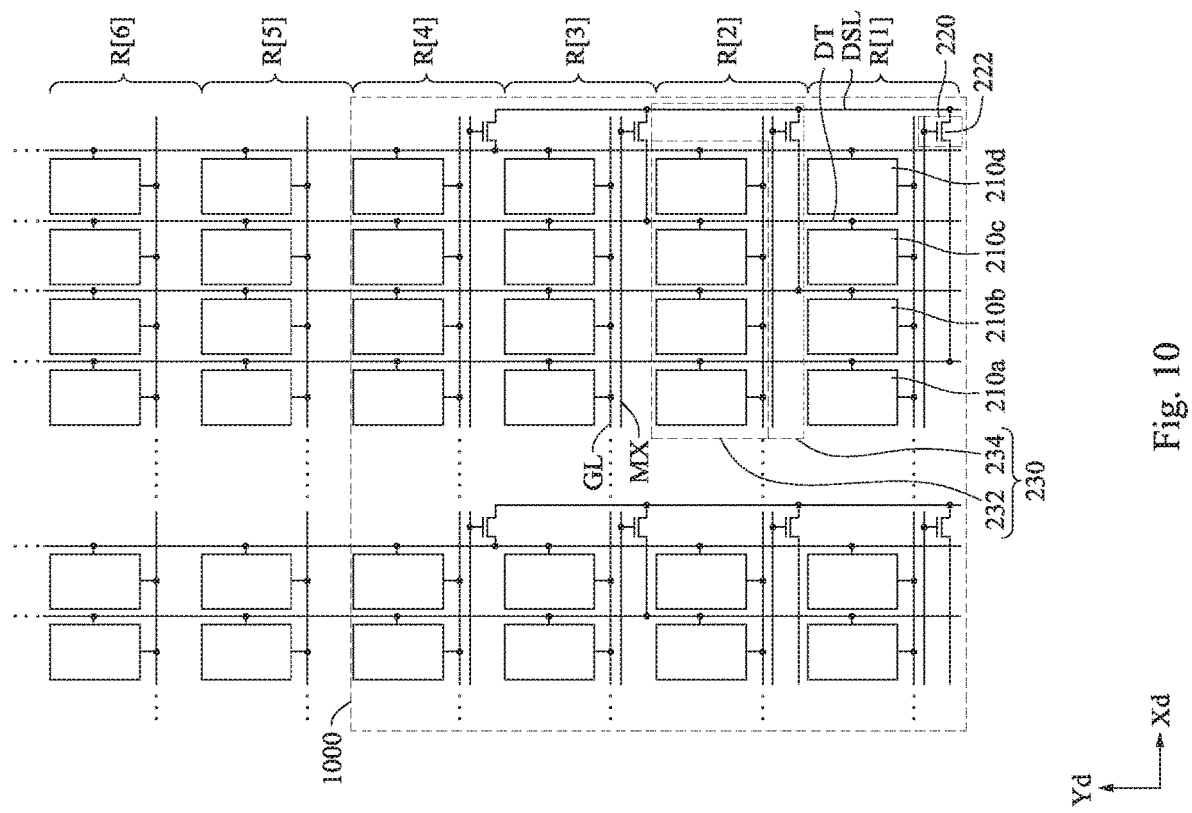
FIG. 10 illustrates a simplified functional block diagram of a multiplex wiring area according to another embodiment of the present disclosure.
Figure 11:
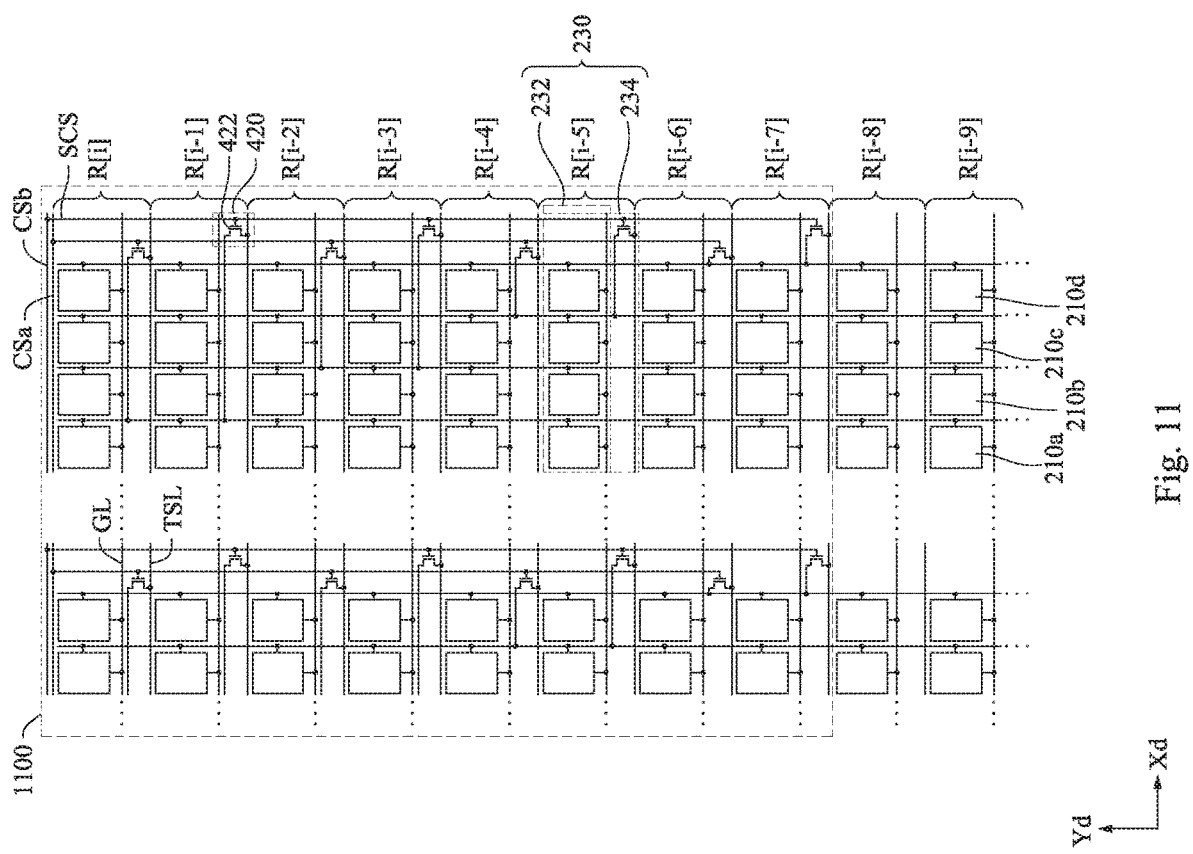
FIG. 11 illustrates a simplified functional block diagram of a test wiring area according to another embodiment of the present disclosure.

FIG. 10 illustrates a simplified functional block diagram of a multiplex wiring area 1000 according to another embodiment of the present disclosure. FIG. 11 illustrates a simplified functional block diagram of the test wiring area 1100 according to another embodiment of the present disclosure. In an embodiment, the multiplex wiring area 130 and the test wiring area 140 in FIG. 1 are implemented by the multiplex wiring area 1000 in FIG. 10 and the test wiring area 1100 in FIG. 11, respectively. The pixel structures PX of the multiplex wiring area 1000 and the test wiring area 1100 are similar to the pixel structures PX of the multiplex wiring area 200 and the test wiring area 400, respectively. The difference is that the pixel structures PX of the multiplex wiring area 1000 and the test wiring area 1100 include four sub-pixel circuits 210, such as the first sub-pixel circuit 210a, the second sub-pixel circuit 210b, the third sub-pixel circuit 210c, and the fourth sub-pixel circuit 210d. Each of said four sub-pixel circuits 210 is coupled to a corresponding sub-pixel light-emitting element 312. Therefore, the light-emitting modules 310 of the pixel structures PX in FIG. 10 and FIG. 11 include four sub-pixel light-emitting elements 312 (not shown in the figure) correspondingly.

The four sub-pixel light-emitting elements 312 electrically connected to the first sub-pixel circuit 210a, the second sub-pixel circuit 210b, the third sub-pixel circuit 210c, and the fourth sub-pixel circuit 210d correspondingly are configured to provide red light, green light, blue light, and green light, respectively, or configured to provide blue light, green light, red light, and green light, respectively, but the color arrangement of the sub-pixels in the present embodiment is not limited thereto.

Reference is made to FIG. 10. The multiplex wiring area 1000 is similar to the multiplex wiring area 200 in FIG. 2, one of the differences is that the multiplex wiring area 1000 includes the first four pixel rows R[1]-R[4] of the pixel rows R[1]-R[n]. Multiple data source lines DSL and multiple (e.g., four) multiplex control lines MX in the multiplex wiring area 1000 can be disposed in the first four pixel rows R[1]-R[4] without extending to other pixel rows, that is, multiple data source lines DSL and multiplex control lines MX can be electrically connected only to the pixel structures PX of the pixel rows R[1]-R[4]. Multiple transistors 222 electrically connected to the same data source line DSL are electrically connected to different data transmission lines DT to distribute the data voltage to different sub-pixel circuits, but the corresponding relationship between the transistors 222 of the pixel rows R[1]-R[4] and the sub-pixel circuits is not limited to the embodiment of FIG. 10. Therefore, multiple internal driving circuits 220 electrically connected to the same data source line DSL form a one-to-four demultiplexer.

Reference is made to FIG. 11. The test wiring area 1100 is similar to the test wiring area 400 in FIG. 4, the difference is that the test wiring area 1100 includes the last eight pixel rows R[i-7]-R[i] of the pixel rows R[1]-R[n], and the test wiring area 1100 further includes the second test control line CSb extending in the first direction Xd. The multiple test source lines TSL and multiple sub-test control lines SCS in the test wiring area 1100 can be disposed only to the last eight pixel rows R[i-7]-R[i] without extending to other pixel rows, that is, the multiple test source lines TSL and the multiple sub-test control lines SCS can be electrically connected only to the pixel structures PX of the pixel rows R[i-7]-R[i]. The internal driving circuits 420 disposed in adjacent rows in the test wiring area 1100 are electrically connected to different test control lines. In addition, multiple transistors 422 electrically connected to the same sub-test control line SCS are electrically connected to different data transmission lines DT to distribute the test voltage to different sub-pixel circuits, but the corresponding relationship between the transistors 422 of the pixel rows R[i-7]-R[i] and the sub-pixel circuits is not limited to the embodiment of FIG. 11.

As can be seen from the above, the number of the pixel rows included in each of the multiplex wiring areas 200, 600, 800, and 1000 can be the same as the number of the output terminals of the demultiplexer included in each of the multiplex wiring areas 200, 600, 800, and 1000, or the same as the number of the multiplex control lines MX. For example, if the number of the output terminals of the demultiplexer in the multiplex wiring area 200 and the number of the multiplex control lines MX are both three, then the multiplex wiring area 200 includes three pixel rows R[1]-R[3]. For another example, the number of the output terminals of the demultiplexer in the multiplex wiring area 600 and the number of the multiplex control lines MX are both six, then the multiplex wiring area 600 includes six pixel rows R[1]-R[6], and so on.

Moreover, the number of pixel rows included in each of the test wiring areas 400, 700, 900, and 1100 may be the number of test control lines therein multiplied by the number of the multiplex control lines MX included in the corresponding multiplex wiring area 200, 600, 800, and 1000. For example, the test wiring area 400 includes one test control line (the first test control line CSa) and the multiplex wiring area 200 includes three multiplex control lines MX, so the test wiring area 400 includes three pixel rows R[i-2]-R[i]. For another example, the test wiring area 900 includes two test control lines (the first test control line CSa and the second test control line CSb) and the multiplex wiring area 800 includes five multiplex control lines MX, so the test wiring area 900 includes ten pixel rows R[i-9]-R[i], and so on.

Furthermore, reference is made to FIG. 1 again. In the aforementioned embodiments, the pixel structure PX of the central area 150 is similar to the pixel structure PX of the multiplex wiring area 130 and the test wiring area 140, but the pixel structure PX of the central area 150 may not include the aforementioned internal driving circuit 220 and the internal driving circuit 420. For example, in the embodiment of that the multiplex wiring area 130 and the test wiring area 140 are implemented by the multiplex wiring area 200 and the test wiring area 400, respectively, the pixel structure PX of the central area 150 may include the first sub-pixel circuit 210a to the third sub-pixel circuit 210c and the light-emitting module 310, in which the light-emitting module 310 includes three sub-pixel light-emitting elements 312. For another example, in the embodiment of that the multiplex wiring area 130 and the test wiring area 140 are implemented by the multiplex wiring area 600 and the test wiring area 700, respectively, the pixel structure PX of the central area 150 may include the first sub-pixel circuit 210a to the sixth sub-pixel circuit 210f and the light-emitting module 310, in which the light-emitting module 310 includes six sub-pixel light-emitting elements 312. For another example, in the embodiment of that the multiplex wiring area 130 and the test wiring area 140 are implemented by the multiplex wiring area 800 and the test wiring area 900, respectively, the pixel structure PX of the central area 150 may include the first sub-pixel circuit 210a to the fifth sub-pixel circuit 210e and the light-emitting module 310, in which the light-emitting module 310 includes five sub-pixel light-emitting elements 312. For another example, in the embodiment of that the multiplex wiring area 130 and the test wiring area 140 are implemented by the multiplex wiring area 1000 and the test wiring area 1100, respectively, the pixel structure PX of the central area 150 may include the first sub-pixel circuit 210a to the fourth sub-pixel circuit 210d and the light-emitting module 310, in which the light-emitting module 310 includes four sub-pixel light-emitting elements 312.

The transistors in the aforementioned embodiments may be implemented by various suitable types of N-type transistors, such as thin-film transistors (TFT), metal-oxide semiconductor field effect transistors or bipolar junction transistors, etc., but the present disclosure is not limited thereto. In practice, the transistors in the aforementioned embodiments can also be implemented by various suitable types of P-type transistors.

In summary, for the display panel 100, all components and wirings required by the demultiplexer and quality test can be arranged in the active area AA rather than in the peripheral area PA. Therefore, it assists the display panel 100 to further reduce the limit of the width of the bezel in the narrow bezel design, so as to provide a good visual effect.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to".

The sizes and relative sizes of some elements shown in the drawings will be enlarged, or the shapes of some elements will be simplified so that the content of the embodiments can be more clearly expressed. Therefore, unless otherwise specified by the applicant, the shape, size, relative size, and relative position of each element in the illustration are merely for convenience of explanation, and should not be used to limit the claim scope of the present disclosure. In addition, the present disclosure can be implemented in many different forms, and when interpreting the present disclosure, it should not be limited to the embodiments described in the specification.

In the description and the claim, if it is described that the first element is located on the second element, above the second element, connected, joined, coupled to or connected to the second element, it means the first element may be directly located on the second element, directly connected, directly joined, or directly coupled to the second element, or it may mean that there are other elements between the first element and the second element. In contrast, if it is described that the first element is directly on the second element, directly connected, directly joined, directly coupled, or directly connected to the second element, it means that there is no other element between the first element and the second element.

In addition, unless emphasizing in the specification, otherwise, any singular expressions also include the meaning of plural expressions.

The above are only the preferred embodiments of the present disclosure, and any changes and modifications made according to the requested items of the present disclosure shall fall within the scope of the present disclosure.

What is claimed is:

1. A pixel structure, comprising:
   a light-emitting module comprising a plurality of sub-pixel light-emitting elements, and disposed on a first plane;
   a plurality of sub-pixel circuits disposed on a second plane, wherein each of the plurality of sub-pixel circuits is electrically connected to a corresponding one of the plurality of sub-pixel light-emitting elements; and
   an internal driving circuit disposed on the second plane, and electrically connected to one of the sub-pixel circuits;
   wherein the first plane is different from the second plane, and the plurality of sub-pixel circuits and the internal driving circuit are located in a vertical projection projected by the light-emitting module onto the second plane,
   wherein the vertical projection comprises a first area and a second area,
   wherein the plurality of sub-pixel circuits are located inside the first area,
   wherein the internal driving circuit is located inside the second area.

2. The pixel structure of claim 1, wherein if the plurality of sub-pixel circuits are disposed in a rectangular area of the second plane, the internal driving circuit is disposed in a L-shaped area of the second plane, and the L-shaped area is connected to two adjacent sides of the rectangular area.

3. The pixel structure of claim 1, wherein each of the plurality of sub-pixel light-emitting elements is an organic light-emitting diode.

4. The pixel structure of claim 1, wherein three of the plurality of sub-pixel light-emitting elements are configured to provide red light, green light, and blue light, respectively.

5. The pixel structure of claim 1, wherein six of the plurality of sub-pixel light-emitting elements are configured to provide red light, green light, blue light, red light, green light, and blue light, respectively.

6. The pixel structure of claim 1, wherein five of the plurality of sub-pixel light-emitting elements are configured to provide red light, green light, blue light, red light, and green light, respectively.

7. A display panel, comprising:
   N multiplex control lines extending in a first direction;

M test control lines extending in the first direction, wherein N and M are positive integers; and a plurality of pixel structures, wherein a portion of the plurality of pixel structures comprises:
  a light-emitting module comprising a plurality of sub-pixel light-emitting elements, and disposed on a first plane;
  a plurality of sub-pixel circuits disposed on a second plane, wherein each of the plurality of sub-pixel circuits is electrically connected to a corresponding one of the plurality of sub-pixel light-emitting elements; and
  an internal driving circuit disposed on the second plane, electrically connected to one of the N multiplex control lines or one of the M test control lines, and electrically connected to one of the plurality of sub-pixel circuits;
  wherein the first plane is different from the second plane, and the plurality of sub-pixel circuits and the internal driving circuit are located in a vertical projection projected by the light-emitting module onto the second plane,
  wherein the vertical projection comprises a first area and a second area,
  wherein the plurality of sub-pixel circuits are located inside the first area,
  wherein the internal driving circuit is located inside the second area.

8. The display panel of claim 7, wherein if the plurality of sub-pixel circuits are disposed in a rectangular area of the second plane, the internal driving circuit is disposed in a L-shaped area of the second plane, and the L-shaped area is connected to two adjacent sides of the rectangular area.

9. The display panel of claim 7, wherein each of another portion of the plurality of pixel structures does not comprise the internal driving circuit.

10. The display panel of claim 7, wherein the plurality of pixel structures are arranged as I pixel rows in the first direction, and the portion of the plurality of pixel structures are disposed in the 1st to the Nth pixel rows and the (I-J+1)th to Ith pixel rows of the I pixel rows, wherein I and J are positive integers and J is M multiplied by N.

11. The display panel of claim 10, wherein the N multiplex control lines are disposed in the 1st to the Nth pixel rows.

12. The display panel of claim 10, further comprising:
  a plurality of data source lines extending in a second direction different from the first direction and disposed in the 1st to the Nth pixel rows; and
  a plurality of test source lines extending in the first direction and disposed in the (I-J+1)th to Ith pixel rows;
  wherein the internal driving circuit comprises a transistor, the transistor comprises a first terminal, a second terminal and a control terminal, the first terminal of the transistor is electrically connected to the one of the plurality of sub-pixel circuits, the second terminal of the transistor is electrically connected to one of the plurality of data source lines or one of the plurality of test source lines, and the control terminal of the transistor is electrically connected to the one of the N multiplex control lines or the one of the M test control lines.

13. The display panel of claim 12, further comprising a plurality of data transmission lines extending in the second direction, wherein the first terminal of the transistor is electrically connected to the one of the plurality of sub-pixel circuits through one of the plurality of data transmission lines,
  wherein each of the plurality of data transmission lines is electrically connected to one of the plurality of data source lines and one of the plurality of test source lines through two transistors of the plurality of transistors of the portion of the plurality of pixel structures.

14. The display panel of claim 7, wherein each of the plurality of sub-pixel light-emitting element is an organic light-emitting diode.

15. The display panel of claim 7, wherein three of the plurality of sub-pixel light-emitting elements are configured to provide red light, green light, and blue light, respectively, and N is 3.

16. The display panel of claim 7, wherein six of the plurality of sub-pixel light-emitting elements are configured to provide red, green, blue, red, green, and blue light, respectively, and N is 6.

17. The display panel of claim 7, wherein five of the plurality of sub-pixel light-emitting elements are configured to provide red light, green light, blue light, red light, and green light, respectively, and N is 5.

18. The display panel of claim 7, wherein four of the plurality of sub-pixel light-emitting elements are configured to provide blue light, green light, red light, and green light, respectively, or configured to provide red light, green light, blue light, and green light, respectively, and N is 4.

19. A display panel comprising a peripheral area and an active area, wherein the active area is configured to provide a display picture, and the active area comprises:
  a test wiring area;
  a central area; and
  a multiplex wiring area, wherein each of the test wiring area, the central area, and the multiplex wiring area comprises a plurality of pixel structures, and each of the plurality of pixel structures comprises:
    a light-emitting module comprising a plurality of sub-pixel light-emitting elements; and
    a plurality of sub-pixel circuits, wherein each of the plurality of sub-pixel circuits is electrically connected to a corresponding one of the plurality of sub-pixel light-emitting elements;
  wherein each of the plurality of pixel structures in the test wiring area and the multiplex wiring area further comprises an internal driving circuit, the internal driving circuit is coupled to one of the plurality of sub-pixel circuits, and each of the plurality of pixel structures in the central area does not comprises the internal driving circuit.

20. The display panel of claim 19, wherein the plurality of pixel structures in the multiplex wiring area are arranged as a plurality of pixel rows, and the internal driving circuits of the plurality of pixel structures in the multiplex wiring area form a plurality of demultiplexers,
  wherein the number of the plurality of pixel rows is the same as the number of output terminals of each demultiplexer.

* * * * *